United States Patent
Lee et al.

(10) Patent No.: US 8,053,342 B2
(45) Date of Patent: Nov. 8, 2011

(54) MASK ROM DEVICE, SEMICONDUCTOR DEVICE INCLUDING THE MASK ROM DEVICE, AND METHODS OF FABRICATING MASK ROM DEVICE AND SEMICONDUCTOR DEVICE

(75) Inventors: Yong-Kyu Lee, Gyeonggi-do (KR);
Jeong-Uk Han, Gyeonggi-do (KR);
Hee-Seog Jeon, Gyeonggi-do (KR);
Young-Ho Kim, Gyeonggi-do (KR);
Myung-Jo Chun, Gyeonggi-do (KR);
Jung-Ho Moon, Seoul (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 0 days.

(21) Appl. No.: 12/836,066

(22) Filed: Jul. 14, 2010

(65) Prior Publication Data
US 2010/0285641 A1    Nov. 11, 2010

Related U.S. Application Data

(62) Division of application No. 12/132,148, filed on Jun. 3, 2008, now Pat. No. 7,777,256.

(30) Foreign Application Priority Data

Jun. 12, 2007  (KR) .................. 10-2007-000057484

(51) Int. Cl.
*H01L 21/8238* (2006.01)
(52) U.S. Cl. ............ 438/527; 257/E27.081; 257/E21.67
(58) Field of Classification Search ............. 438/527; 257/213, 369, 391
See application file for complete search history.

(56) References Cited

U.S. PATENT DOCUMENTS

2008/0179692 A1 *  7/2008  Chun et al. .............. 257/391
* cited by examiner

*Primary Examiner* — Ahmed Sefer
(74) *Attorney, Agent, or Firm* — F. Chau & Associates, LLC

(57) ABSTRACT

A mask read-only memory (ROM) device, which can stably output data, includes an on-cell and an off-cell. The on-cell includes an on-cell gate structure on a substrate and an on-cell junction structure within the substrate. The off-cell includes an off-cell gate structure on the substrate and an off-cell junction structure within the substrate. The on-cell gate structure includes an on-cell gate insulating film, an on-cell gate electrode and an on-cell gate spacer. The on-cell junction structure includes first and second on-cell ion implantation regions of a first polarity and third and fourth on-cell ion implantation regions of a second polarity. The off-cell gate structure includes an off-cell gate insulating film, an off-cell gate electrode and an off-cell gate spacer. The off-cell junction structure includes first and second off-cell ion implantation regions of the first polarity and a third off-cell ion implantation region of the second polarity.

7 Claims, 12 Drawing Sheets

US 8,053,342 B2

MASK ROM DEVICE, SEMICONDUCTOR DEVICE INCLUDING THE MASK ROM DEVICE, AND METHODS OF FABRICATING MASK ROM DEVICE AND SEMICONDUCTOR DEVICE

CROSS-REFERENCE TO RELATED APPLICATIONS

This application is a Divisional of U.S. application Ser. No. 12/132,148 filed on Jun. 3, 2008 now U.S. Pat. No. 7,777,256, which claims priority to Korean Patent Application No. 10-2007-0057484, filed on Jun. 12, 2007, in the Korean Intellectual Property Office, the disclosures of which are incorporated by reference herein in their entireties.

This application claims the benefit of foreign priority to Korean Patent Application No. 10-2007-0057484 filed on Jun. 12, 2007, the disclosure of which is incorporated herein by reference in its entirety.

BACKGROUND

1. Field of Invention

Embodiments of the present invention relate generally to mask read-only-memory (ROM) devices, semiconductor devices including mask ROM devices and methods of fabricating the mask ROM devices and semiconductor device including the same. More particularly, embodiments of the present invention relate to a mask ROM device including a cell junction, which has ion implantation regions of opposite polarities and thus enables an on-cell and an off-cell to operate stably, a semiconductor device including such a mask ROM device, and methods of fabricating the mask ROM device and the semiconductor device.

2. Description of the Related Art

Mask read-only-memory (ROM) devices are read-only semiconductor memory devices to which data cannot be written. A mask ROM device includes an on-cell and an off-cell. When activated, the on-cell remains on so that electric current can be transmitted from a source region to a drain region. On the other hand, the off-cell does not transmit electric current and remains off. Each cell has a transistor structure.

The term "on-cell" refers to a cell having a transistor structure in which a channel is formed in response to an activation voltage applied to a gate electrode and thus electric current is transmitted through the channel. The term "off-cell" refers to a cell having a transistor structure in which no channel is formed and thus electric current is not transmitted. When fabricated, the mask ROM device stores predetermined data. For example, the on-cell denotes data 1, and the off-cell denotes data 0.

In the mask ROM device, it is particularly important for the off-cell to stably output data 0. Accordingly, it is important that no channel is formed—even when the activation voltage is applied to a gate electrode therein. For this reason, numerous methods of preventing the formation of a channel have been suggested. In one method, ions of a polarity opposite to that of a channel are implanted into a channel region in order to prevent the formation of the channel. However, as a design rule of gate electrodes is reduced, it can be very difficult to implant ions into the channel region.

As the channel regions into which ions are implanted are reduced, it becomes more difficult to form ion implantation mask patterns at precise locations. In addition, because ions penetrate through the gate electrode, high ion implantation energy is required. Therefore, a very thick ion implantation mask must be formed. Because a high concentration of ions of a polarity opposite to that of the channel are also implanted into a junction region, leakage current increases while a breakdown voltage is reduced.

SUMMARY

Embodiments exemplarily described herein can be characterized as capable of providing a mask read-only-memory (ROM) device in which a transistor of an on-cell can maintains low leakage current and a sufficiently high breakdown voltage and a transistor of an off-cell can stably output data because no channel is formed even when the transistor is activated. It will be appreciated, however, that features of embodiments exemplarily described herein are not restricted to the one set forth herein. The above and other features of embodiments exemplarily described herein will become more apparent to one of ordinary skill in the art to which the present invention pertains by referencing the detailed description below.

According to one embodiment, a mask ROM device can be generally characterized as including an on-cell and an off-cell. The on-cell may include an on-cell gate structure formed on a substrate and comprising an on-cell gate insulating film, an on-cell gate electrode, and an on-cell gate spacer; and an on-cell junction structure formed within the substrate and comprising first and second on-cell ion implantation regions of a first polarity and third and fourth on-cell ion implantation regions of a second polarity. The off-cell may include an off-cell gate structure formed on the substrate and comprising an off-cell gate insulating film, an off-cell gate electrode, and an off-cell gate spacer; and an off-cell junction structure formed within the substrate comprising first and second off-cell ion implantation regions of the first polarity and a third off-cell ion implantation region of the second polarity.

According to one embodiment, a method of fabricating a mask ROM device can be generally characterized as forming an on-cell gate insulating film and an off-cell gate insulating film on a substrate; forming an on-cell gate electrode on the on-cell gate insulating film; forming an off-cell gate electrode on the off-cell gate insulating film; performing a first ion implantation process and a second ion implantation process using ions of a first polarity to form a first on-cell ion implantation region, a first off-cell ion implantation region, a second on-cell ion implantation region and a second off-cell ion implantation region, wherein the first and second on-cell ion implantation regions are aligned with a side surface of the on-cell gate electrode and wherein the first and second off-cell ion implantation regions are aligned with a side surface of the off-cell gate electrode; performing a third ion implantation process using ions of a second polarity to form a third on-cell ion implantation region that is aligned with the side surfaces of the on-cell gate electrode and the off-cell gate electrode; forming gate spacers on the side surfaces of the on-cell gate electrode and the off-cell gate electrode; and performing a fourth ion implantation process to form a fourth on-cell ion implantation region and a third off-cell ion implantation region that are aligned with the gate spacers.

According to one embodiment, a semiconductor device can be generally characterized as comprising a mask ROM device and a CMOS. The mask ROM device may include an on-cell comprising an on-cell gate structure formed on a first region of the substrate and an on-cell junction structure formed within the first region of the substrate; and an off-cell comprising an off-cell gate structure formed on the first region of the substrate and an off-cell junction structure formed within the first region of the substrate. The CMOS may include a PMOS gate structure comprising a PMOS gate insulating film, a PMOS gate electrode and a PMOS gate spacer formed on a second region of the substrate; a PMOS structure comprising a P-type ion implantation region formed within the second region of the substrate; an NMOS gate structure comprising an NMOS gate insulating film, an NMOS gate electrode and an NMOS gate spacer formed on the second region of the substrate; and an NMOS structure comprising an N-type ion implantation region formed within the second region of the substrate. The on-cell gate structure may include an on-cell gate insulating film, an on-cell gate electrode and an on-cell gate spacer. The on-cell junction structure may include first and second on-cell ion implantation regions of a first polarity and third and fourth on-cell ion implantation regions of a second polarity. The off-cell gate structure may include an off-cell gate insulating film, an off-cell gate electrode and an off-cell gate spacer formed on the first region of the substrate. The off-cell junction structure may include first and second off-cell ion implantation regions of the first polarity and a third off-cell ion implantation region of the second polarity.

According to one embodiment, a method of fabricating a semiconductor device can be generally characterized as forming an on-cell gate insulating film and an off-cell gate insulating film on a first region of a substrate and forming a CMOS gate insulating film on a second region of the substrate; forming an on-cell gate electrode on the on-cell gate insulating film; forming an off-cell gate electrode on the off-cell gate insulating film; forming an NMOS gate electrode and a PMOS gate electrode on the CMOS gate insulating film; performing a first ion implantation process and a second ion implantation process using ions of a first polarity to form a first on-cell ion implantation region, a first off-cell ion implantation region, a second on-cell ion implantation region and a second off-cell ion implantation region that are aligned with side surfaces of the on-cell gate electrode and the off-cell gate electrode; performing a third ion implantation process using ions of a second polarity to form a third on-cell ion implantation region and a first NMOS ion implantation region that are aligned with side surfaces of the on-cell gate electrode and the NMOS gate electrode, respectively; performing a fourth ion implantation process using ions of the first polarity to form a first PMOS ion implantation region that is aligned with a side surface of the PMOS gate electrode; forming an on-cell gate spacer, an off-cell gate spacer, an NMOS gate spacer and a PMOS gate spacer on the side surfaces of the on-cell and off-cell gate electrodes and the NMOS and PMOS gate electrodes, respectively; performing a fifth ion implantation process using ions of the second polarity to form a fourth on-cell ion implantation region, a third off-cell ion implantation region and a second NMOS ion implantation region that are aligned with the on-cell gate spacer, the off-cell gate spacer and the NMOS gate spacer, respectively; and performing a sixth ion implantation region using ions of the first polarity to form a second PMOS ion implantation region that is aligned with the PMOS gate spacer.

Other embodiments of the present invention are included in the following detailed description and the accompanying drawings.

BRIEF DESCRIPTION OF THE DRAWINGS

The above and other features of the embodiments exemplarily described above will become more apparent by describing in detail embodiments thereof with reference to the attached drawings in which.

DETAILED DESCRIPTION

Figure 1:
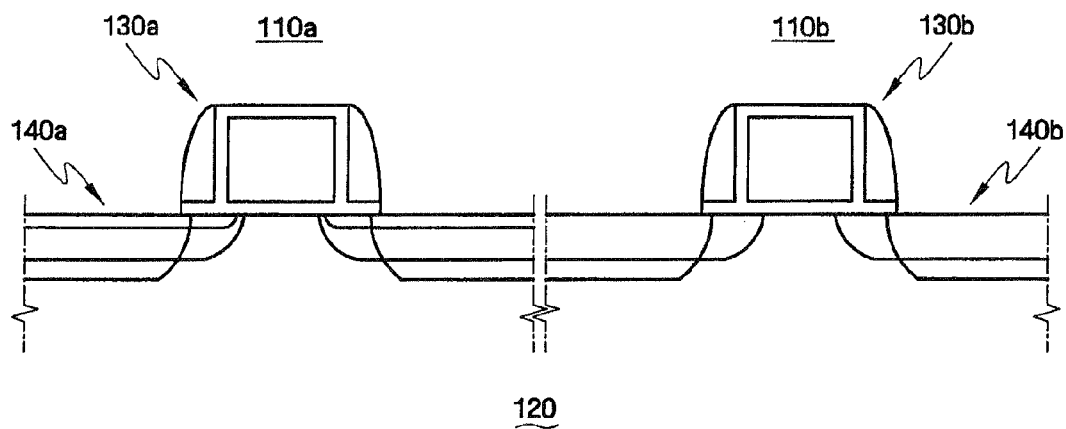
FIG. 1 is a schematic diagram illustrating a mask ROM device according to an exemplary embodiment.

Exemplary embodiments of the present invention will now be described more fully with reference to the accompanying drawings. These embodiments may, however, be realized in many different forms and should not be construed as being limited to the embodiments set forth herein. Rather, these embodiments are provided so that this disclosure will be thorough and complete, and will fully convey the concept of the invention to those skilled in the art. In the drawings, sizes and relative sizes of the layers and regions are exaggerated for clarity. Like reference numerals in the drawings denote like elements, and thus their description will be omitted.

Exemplary embodiments of the present invention are described herein with reference to cross-sectional illustrations representing idealized embodiments. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. Thus, the regions illustrated in the figures are schematic in nature and their shapes are not intended to illustrate the actual shape of a region of a device and are not intended to limit the scope of the invention as defined in the claims.

As used herein, the term "N-type ion" may refer to an ionized element that belongs to group V of a periodic table, such as phosphorous (P) or arsenic (As). In addition, the term "P-type ion" may refer to an ionized element that belongs to group III of the periodic table, such as boron (B) or boron tri-fluoride ($BF_3$).

As used herein, the terms "high concentration" and "low concentration" refer to relative concentrations based on a comparison of two concentrations and does not necessarily refer to a preset concentration.

Hereinafter, a mask ROM device and a method of fabricating the same according to one exemplary embodiment will be described in detail with reference to the attached drawings.

FIG. 1 is a schematic diagram illustrating a mask ROM device 100 according to an exemplary embodiment.

Referring to FIG. 1, the mask ROM device 100 includes an on-cell 110a and an off-cell 110b. The on-cell 110a includes an on-cell gate structure 130a and an on-cell junction structure 140a on a substrate 120. The off-cell 110b includes an off-cell gate structure 130b and an off-cell junction structure 140b on the substrate 120.

The on-cell junction structure 140a of the on-cell 110a and the off-cell junction structure 140b of the off-cell 110b include ion implantation regions having various polarities, concentrations and shapes. Each ion implantation region of the on-cell junction structure 140a and the off-cell junction structure 140b is exemplarily illustrated in FIG. 1 as if it had an independent shape. However, the ion implantation regions may actually appear to be a single ion implantation region due to diffusion and recombination. In addition, a boundary line or interface of each ion implantation region illustrated in FIG. 1 is exemplary and may be modified to various shapes, which will be described in greater detail below.

Figure 2A:
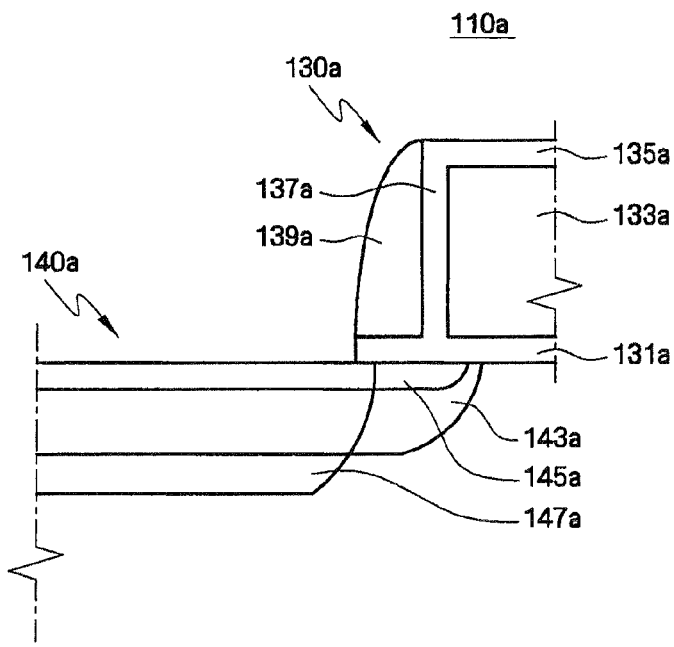
FIGS. 2A and 2B are enlarged views of an on-cell gate structure and an on-cell junction structure of an on-cell and an off-cell gate structure and an off-cell junction structure of an off-cell, exemplarily illustrated in FIG. 1.
Figure 2B:
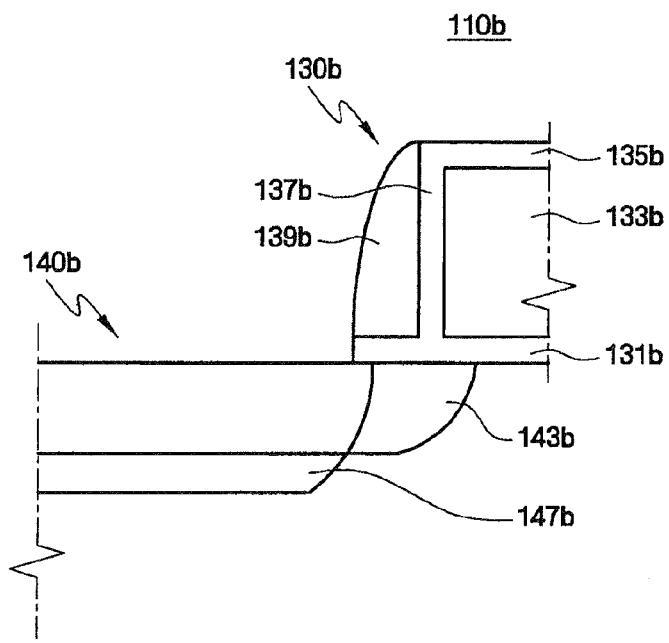

FIGS. 2A and 2B are enlarged views of the on-cell gate structure 130a and the on-cell junction structure 140a of the on-cell 110a and the off-cell gate structure 130b and the off-cell junction structure 140b of the off-cell 110b exemplarily illustrated in FIG. 1.

FIG. 2A is a schematic diagram illustrating the on-cell gate structure 130a and the on-cell junction structure 140a of the on-cell 110a.

Referring to FIG. 2A, the on-cell 110a includes the on-cell gate structure 130a and the on-cell junction structure 140a.

The on-cell gate structure 130a includes an on-cell gate insulating film 131a, an on-cell gate electrode 133a, an on-cell gate capping layer 135a, an on-cell gate sidewall 137a, and an on-cell gate spacer 139a.

The on-cell junction structure 140a includes a first on-cell ion implantation region 143a, a second on-cell ion implantation region 145a, and a third on-cell ion implantation region 147a.

The on-cell gate insulating film 131a, the on-cell gate electrode 133a, the on-cell gate capping layer 135a, the on-cell gate sidewall 137a, and the on-cell gate spacer 139a in the on-cell gate structure 130a function as a gate insulating film, a gate electrode, a gate capping layer, a gate sidewall, and a gate spacer, respectively.

Each of the on-cell gate insulating film 131a, the on-cell gate electrode 133a, the on-cell gate capping layer 135a and the on-cell gate sidewall 137a may include a material such as silicon oxide. In one embodiment, each of the on-cell gate insulating film 131a, the on-cell gate electrode 133a, the on-cell gate capping layer 135a and the on-cell gate sidewall 137a may be formed of a silicon oxide film. The on-cell gate spacer 139a may include a material such as silicon nitride, silicon oxynitride, or the like or a combination thereof. In one embodiment, the on-cell gate spacer 139a may be formed of a silicon nitride film. It will be appreciated, however, that the materials and films of the various structures is not necessarily limited thereto. For example, a combination of various insulating materials and/or films of insulating materials such as aluminum oxide, hafnium oxide, silicon oxynitride or the like may also be used in addition to, or in place of, silicon oxide.

A method of forming the on-cell gate insulating film 131a, the on-cell gate electrode 133a, the on-cell gate capping layer 135a, the on-cell gate sidewall 137a, and the on-cell gate spacer 139a will be described in greater detail below.

The polarity of the first on-cell ion implantation region 143a may be opposite to that of a channel. For example, if the channel is of an N-type, the first on-cell ion implantation region 143a may be of a P-type. Conversely, if the channel is of the P-type, the first on-cell ion implantation region 143a may be of the N-type. Because an N-type channel is formed in an NMOS, the first on-cell ion implantation region 143 may be formed by implanting P-type ions. Because a P-type channel is formed in a PMOS, the first on-cell ion implantation region 143 may be formed by implanting N-type ions.

The first on-cell ion implantation region 143a may extend to a point under the on-cell gate electrode 133a. Accordingly, the first on-cell ion implantation region 143a may extend further under the on-cell gate electrode 133a than the second and third on-cell ion implantation regions 145a and 147a in a horizontal direction. Because the polarity of the first on-cell ion implantation region 143a is opposite to that of the channel, the first on-cell ion implantation region 143a can, in one embodiment, prevent a short-channel effect. That is, the first on-cell ion implantation region 143a can prevent more junction extension than is necessary. In this case, the first on-cell ion implantation region 143a may perform the function of a halo or a pocket well.

In one embodiment, the polarity of the second on-cell ion implantation region 145a may be identical to that of the channel. The second on-cell ion implantation region 145a may have a relatively lower concentration of ions than the third on-cell ion implantation region 147a. In addition, the second on-cell ion implantation region 145a may be the shallowest among the first through third on-cell ion implantation regions 143a through 147a. In a junction structure known as a lightly doped drain (LDD), the second on-cell ion implantation region 145a may be formed by implanting ions to a low concentration.

In one embodiment, the polarity of the third on-cell ion implantation region 147a may be identical to that of the channel. The third on-cell ion implantation region 147a may have a relatively higher concentration of ions than the second on-cell ion implantation region 145a. In one embodiment, the third on-cell ion implantation region 147a may be the deepest among the first through third on-cell ion implantation regions 143a through 147a. In another embodiment, however, the first on-cell ion implantation region 143a may be formed deeper than the third on-cell ion implantation region 147a. In the junction structure known as the LDD, the third on-cell ion implantation region 147a may be formed by implanting ions to a high concentration.

A method of forming the first through third on-cell ion implantation regions 143a through 147a will be described in greater detail below.

When the on-cell 110a is activated in response to an activation voltage, which is applied to the on-cell gate electrode 133a, a channel is formed and electric current is transmitted through the channel. Thus, when the on-cell 110a is activated, the on-cell 110a outputs data 1.

FIG. 2B is a schematic diagram illustrating the off-cell gate structure 130b and the off-cell junction structure 140b of the off-cell 110b.

Referring to FIG. 2b, the off-cell 110b includes the off-cell gate structure 130b and the off-cell junction structure 140b.

The off-cell gate structure 130b includes an off-cell gate insulating film 131b, an off-cell gate electrode 133b, an off-cell gate capping layer 135b, an off-cell gate sidewall 137b, and an off-cell gate spacer 139b.

The off-cell junction structure 140b includes a first off-cell ion implantation region 143b and a second off-cell ion implantation region 145b.

The off-cell gate insulating film 131b, the off-cell gate electrode 133b, the off-cell gate capping layer 135b, the off-cell gate sidewall 137b, and the off-cell gate spacer 139b may be formed at the same time as the on-cell gate insulating film 131a, the on-cell gate electrode 133a, the on-cell gate capping layer 135a, the on-cell gate sidewall 137a, and the on-cell gate spacer 139a. In addition, the off-cell gate insulating film 131b, the off-cell gate electrode 133b, the off-cell gate capping layer 135b, the off-cell gate sidewall 137b, and the off-cell gate spacer 139b may perform the same transistor functions as the on-cell gate insulating film 131a, the on-cell gate electrode 133a, the on-cell gate capping layer 135a, the on-cell gate sidewall 137a, and the on-cell gate spacer 139a.

The on-cell gate structure 130a illustrated in FIG. 2A and the off-cell gate structure 130b illustrated in FIG. 2B may be formed simultaneously, which will be described in greater detail below.

The first off-cell ion implantation region 143b may be formed by implanting ions of the same polarity as that of the first on-cell ion implantation region 143a. In addition, the first off-cell ion implantation region 143b and the first on-cell ion implantation region 143a may be formed simultaneously, which will be described in greater detail below. The first off-cell ion implantation region 143b may extend to a point under the off-cell gate electrode 133b. Accordingly, the first off-cell ion implantation region 143b may extend further under the off-cell gate electrode 133b than the second off-cell ion implantation region 147b in a horizontal direction.

In one embodiment, the second off-cell ion implantation region 147b may be formed by implanting ions of the same polarity as that of the third on-cell ion implantation region 147a. In addition, the second off-cell ion implantation region 147b and the third on-cell ion implantation region 147a may be formed simultaneously, which will be described in greater detail below. In one embodiment, the second off-cell ion implantation region 147b may be formed deeper than the first off-cell ion implantation region 143b. In another embodiment, however, the first off-cell ion implantation region 143b may be formed deeper than the second off-cell ion implantation region 147b.

The off-cell 110b does not have an ion implantation region (corresponding to the second on-cell ion implantation region 145a of FIG. 2A) in which a channel to the on-cell 110a can be formed. Therefore, even if the activation voltage is applied to the gate electrode 133b, no channel is formed. Because electric current is not transmitted, the off-cell 110b always outputs data 0 (zero).

Figure 3:
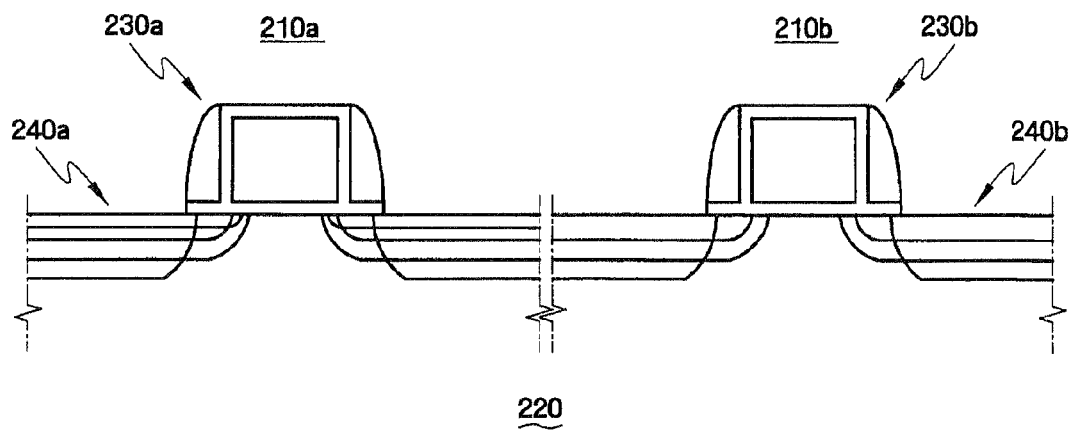
FIG. 3 is a schematic diagram illustrating a mask ROM device according to another exemplary embodiment.

FIG. 3 is a schematic diagram illustrating a mask ROM device 200 according to another exemplary embodiment.

Referring to FIG. 3, the mask ROM device 200 includes an on-cell 210a and an off cell 210b. The on-cell 210a includes an on-cell gate structure 230a and an on-cell junction structure 240a on a substrate 220. The off-cell 210b includes an off-cell gate structure 230b and an off-cell junction structure 240b on the substrate 220.

In one embodiment, the on-cell junction structure 240a of the on-cell 210a and the off-cell junction structure 240b of the off-cell 210b include ion implantation regions having various polarities and concentrations. Each ion implantation region of the on-cell junction structure 240a and the off-cell junction structure 240b is illustrated in FIG. 3 as if it had an independent shape. However, the ion implantation regions may actually appear to be a single ion implantation region due to diffusion and recombination. In addition, a boundary line or interface of each ion implantation region illustrated in FIG. 3 is exemplary and may be modified to various shapes, which will be described in greater detail below.

The on-cell junction structure 240a and the off-cell junction structure 240b of the mask ROM device illustrated in FIG. 3 may be more elaborate than those of the mask ROM device illustrated in FIG. 1. For example, while ion implantation regions into which ions of a polarity opposite to that of a channel are implanted are formed as a wide region in the mask ROM device 100 shown in FIG. 1, they are formed as two regions in the mask ROM device 200 shown in FIG. 3. Each ion implantation region can be formed in two step ion implantation processes, and the position of each ion implantation region is not necessarily distinguished, which will be described in greater detail below.

Figure 4A:
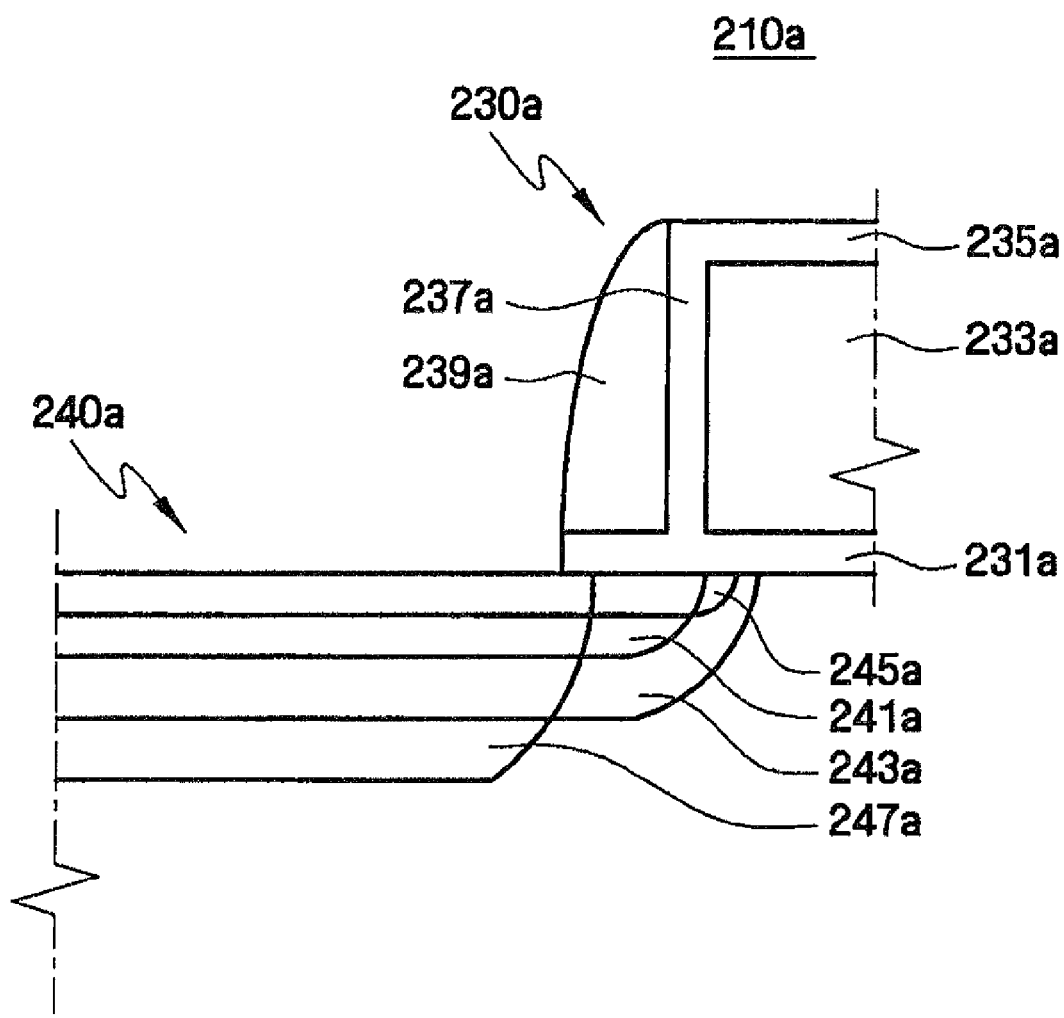
FIGS. 4A and 4B are enlarged views of an on-cell gate structure and an on-cell junction structure of an on-cell and an off-cell gate structure and an off-cell junction structure of an off-cell, exemplarily illustrated in FIG. 3.
Figure 4B:
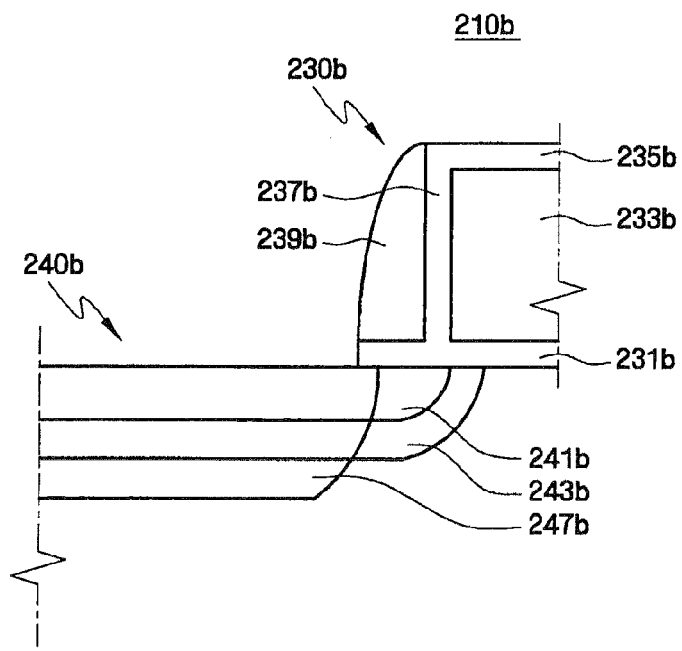

FIGS. 4A and 4B are enlarged views of the on-cell gate structure 230a and the on-cell junction structure 240a of the on-cell 210a and the off-cell gate structure 230b and the off-cell junction structure 240b of the off-cell 210b exemplarily illustrated in FIG. 3.

FIG. 4A is a schematic diagram illustrating the on-cell gate structure 230a and the on-cell junction structure 240a of the on-cell 210a.

Referring to FIG. 4A, the on-cell 210a includes the on-cell gate structure 230a and the on-cell junction structure 240a.

The on-cell gate structure 230a includes an on-cell gate insulating film 231a, an on-cell gate electrode 233a, an on-cell gate capping layer 235a, an on-cell gate sidewall 237a, and an on-cell gate spacer 239a.

The on-cell junction structure 240a includes a first on-cell ion implantation region 241a, a second on-cell ion implantation region 243a, a third on-cell ion implantation region 245a, and a fourth on-cell ion implantation region 247a.

The on-cell gate insulating film 231a, the on-cell gate electrode 233a, the on-cell gate capping layer 235a, the on-cell gate sidewall 237a, and the on-cell gate spacer 239a in the on-cell gate structure 230a function as a gate insulating film, a gate electrode, a gate capping layer, a gate sidewall, and a gate spacer, respectively.

Each of the on-cell gate insulating film 231a, the on-cell gate electrode 233a, the on-cell gate capping layer 235a and the on-cell gate sidewall 237a may include a material such as silicon oxide. In one embodiment, each of the on-cell gate insulating film 231a, the on-cell gate electrode 233a, the on-cell gate capping layer 235a and the on-cell gate sidewall 237a may be formed of a silicon oxide film. The on-cell gate spacer 239a may include a material such as silicon nitride, silicon oxynitride, or the like of a combination thereof. In one embodiment, the on-cell gate spacer 239a may be formed of a silicon nitride film. It will be appreciated, however, that the materials and films of the various structures is not necessarily limited thereto. For example, a combination of various insulating materials and/or films of insulating materials such as aluminum oxide, hafnium oxide, and silicon oxynitride, or the like may also be used in addition to, or in place of, silicon oxide.

A method of forming the on-cell gate insulating film 231a, the on-cell gate electrode 233a, the on-cell gate capping layer 235a, the on-cell gate sidewall 237a, and the on-cell gate spacer 239a will be described in greater detail below.

The polarity of the first on-cell ion implantation region 241a and that of the second on-cell ion implantation region 243a may be opposite to that of a channel. For example, if the channel is of the N-type, the first on-cell ion implantation region 241a and the second on-cell ion implantation region 243a may be of the P-type. Conversely, if the channel is of the P-type, the first on-cell ion implantation region 241a and the second on-cell ion implantation region 243a may be of the N-type.

The second on-cell ion implantation region 243a may extend to a point under the on-cell gate electrode 233a. Accordingly, the second on-cell ion implantation region 243a may extend further than the first, third and fourth on-cell ion implantation regions 241a, 245a and 247a under the on-cell gate electrode 233a in a horizontal direction. Because the polarity of the second on-cell ion implantation region 243a is opposite to that of the channel, the second on-cell ion implantation region 243a can prevent the short-channel effect. In this case, the second on-cell ion implantation region 243a may perform the function of a halo or a pocket well.

The second on-cell ion implantation region 243a may surround the first on-cell ion implantation region 241a.

In one embodiment, the polarity of the third on-cell ion implantation region 245a may be identical to that of the channel. The third on-cell ion implantation region 245a may have a relatively lower concentration of ions than the fourth on-cell ion implantation region 247a. In addition, the third on-cell ion implantation region 245a may be the shallowest among the first through fourth on-cell ion implantation regions 241a through 247a. In the junction structure known as the LDD, the third on-cell ion implantation region 245a may be formed by implanting ions to a low concentration.

In one embodiment, the polarity of the fourth on-cell ion implantation region 247a may be identical to that of the channel. The fourth on-cell ion implantation region 247a may have a relatively higher concentration of ions than the third on-cell ion implantation region 245a. In one embodiment, the fourth on-cell ion implantation region 247a may be the deepest among the first through fourth on-cell ion implantation regions 241a through 247a. In another embodiment, however, the second on-cell ion implantation region 243a may be formed deeper than the fourth on-cell ion implantation region 247a. In the junction structure known as the LDD, the fourth on-cell ion implantation region 247a may be formed by implanting ions to a high concentration.

A method of forming the first through fourth on-cell ion implantation regions 241a through 247a will be described in greater detail below.

When the on-cell 210a is activated in response to the activation voltage, which is applied to the on-cell gate electrode 233a, a channel is formed and electric current is transmitted through the channel. Thus, when the on-cell 210a is activated, the on-cell 210a outputs data 1.

FIG. 4B is a schematic diagram illustrating the off-cell gate structure 230b and the off-cell junction structure 240b of the off-cell 210b. Referring to FIG. 4b, the off-cell 210b includes the off-cell gate structure 230b and the off-cell junction structure 240b.

The off-cell gate structure 230b includes an off-cell gate insulating film 231b, an off-cell gate electrode 233b, an off-cell gate capping layer 235b, an off-cell gate sidewall 237b, and an off-cell gate spacer 239b.

The off-cell junction structure 240b includes a first off-cell ion implantation region 241b, a second off-cell ion implantation region 243b, and a third off-cell ion implantation region 247b.

The off-cell gate insulating film 231b, the off-cell gate electrode 233b, the off-cell gate capping layer 235b, the off-cell gate sidewall 237b, and the off-cell gate spacer 239b may be formed at the same time as the on-cell gate insulating film 231a, the on-cell gate electrode 233a, the on-cell gate capping layer 235a, the on-cell gate sidewall 237a, and the on-cell gate spacer 239a. In addition, the off-cell gate insulating film 231b, the off-cell gate electrode 233b, the off-cell gate capping layer 235b, the off-cell gate sidewall 237b, and the off-cell gate spacer 239b may perform the same transistor functions as the on-cell gate insulating film 231a, the on-cell gate electrode 233a, the on-cell gate capping layer 235a, the on-cell gate sidewall 237a, and the on-cell gate spacer 239a.

The off-cell gate structure 230a illustrated in FIG. 4A and the off-cell gate structure 230b illustrated in FIG. 4B may be formed simultaneously, and thus a detailed description thereof will be omitted.

The first off-cell ion implantation region 241b and the second off-cell ion implantation region 243b may be formed by implanting ions with the same polarities with those of the first on-cell ion implantation region 241a and the second on-cell ion implantation region 243a. The second off-cell ion implantation region 243b may extend to a point under the off-cell gate electrode 233b. Accordingly, the second off-cell ion implantation region 243b may extend further under the off-cell gate electrode 233b than the third off-cell ion implantation region 247b in a horizontal direction.

The second off-cell in implantation region 243b may surround the first off-cell ion implantation region 241b.

In one embodiment, the polarity of the third off-cell ion implantation region 247b may be identical to that of the fourth on-cell ion implantation region 247a. In addition, the third off-cell ion implantation region 247b and the fourth on-cell ion implantation region 247a may be formed simultaneously. In one embodiment, the third off-cell ion implantation region 247b may be formed deeper than the second off-cell ion implantation region 243b. In another embodiment, however, the second off-cell ion implantation region 243b may be formed deeper than the third off-cell ion implantation region 247b.

The off-cell 210b does not have an ion implantation region (corresponding to the first on-cell ion implantation region 245a of FIG. 4A) in which a channel to the on-cell 210a can be formed. Therefore, even if the activation voltage is applied to the gate electrode 233b, no channel is formed. Because electric current is not transmitted, the off-cell 210b always outputs data 0 (zero).

A method of forming the first through third off-cell ion implantation regions 241b, 243b and 247b will be described in greater detail below.

Hereinafter, an exemplary embodiment method of forming a gate structure and a junction structure of a mask ROM device will be described with reference to FIGS. 5A through 5F.

FIGS. 5A through 5F may not exactly match FIGS. 1 through 4B illustrating the mask ROM devices 100 and 200 described above because a description of a heat-treatment process, which accompanies an ion implantation process, is omitted in order to promote the understanding of the technical spirit of the concepts described herein. After the heat-treatment process, ion implantation regions are diffused. However, the heat-treatment process is not illustrated in FIGS. 5A through 5F. Nevertheless, it should be understood that the heat-treatment process is not omitted. For example, the heat-treatment process may be performed after every implantation process or after every two or more ion implantation processes.

Figure 5A:
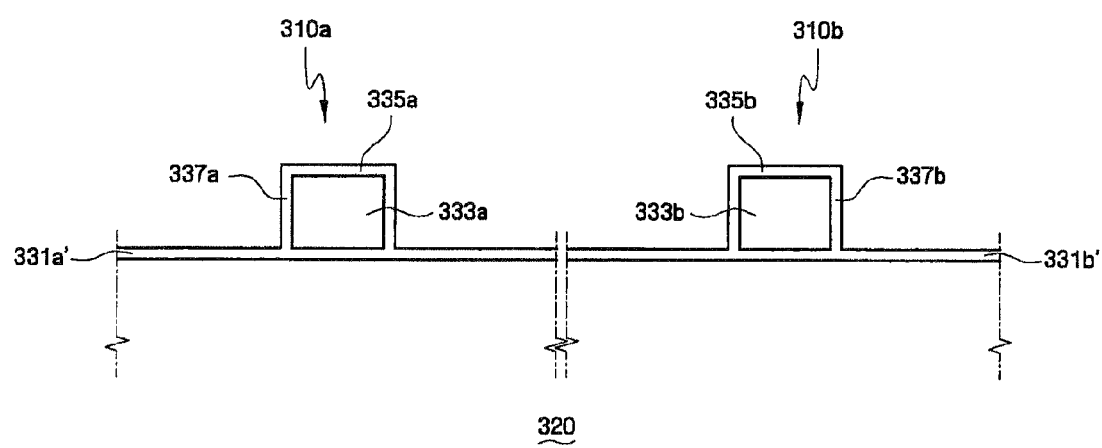
FIGS. 5A through 5F illustrate one embodiment of an exemplary method of forming a gate structure and a junction structure of a mask ROM device.

Referring to FIG. 5A, an on-cell gate structure 310a and an off-cell gate structure 310b, each of which does not have a spacer, are formed on a substrate 320.

The on-cell gate structure 310a includes an on-cell gate insulating film 331a', an on-cell gate electrode 333a, an on-cell gate capping layer 335a and an on-cell gate sidewall 337a. The off-cell gate structure 310b includes an off-cell gate insulating film 331b', an off-cell gate electrode 333b, an off-cell gate capping layer 335b and an off-cell gate sidewall 337b. The on-cell gate structure 310a' and the off-cell gate structure 310b' may be formed simultaneously.

Each of the on-cell gate insulating film 331a' and the off-cell gate insulating film 331b' may include a material such as silicon oxide, aluminum oxide, hafnium oxide, or the like or a combination thereof. In one embodiment, each of the on-cell gate insulating film 331a' and the off-cell gate insulating film 331b' may be formed of a silicon oxide film, an aluminum oxide film, a hafnium oxide film or the like or a combination thereof. In embodiments where the on-cell gate insulating film 331a' and the off-cell gate insulating film 331b' are formed of a silicon oxide film, the silicon substrate 320 may be oxidized or a silicon oxide film may be deposited on the silicon substrate 320 to form each of the on-cell gate insulating film 331a' and the off-cell gate insulating film 331b'.

When each of the on-cell gate insulating film 331a' and the off-cell gate insulating film 331b' is formed by depositing the silicon oxide film, a chemical vapor deposition (CVD) method, an atomic layer deposition (ALD) method, or the like may be used. When each of the on-cell gate insulating film 331a' and the off-cell gate insulating film 331b' is formed of an insulating film other than the silicon oxide film, an appropriate deposition method may be used.

Each of the on-cell gate electrode 333a and the off-cell gate electrode 333b comprises a conductive material and may be a single layer or a multi-layer including polycrystalline silicon, metal-silicide, one or more metal compounds, or one or more metals.

The on-cell gate capping layer 335a and off-cell gate capping layers 335b and the on-cell gate sidewalls 337a and off-cell gate sidewalls 337b are formed on top and side surfaces of the on-cell gate electrode 333a and off-cell gate electrodes 333b, respectively, thereby protecting the on-cell and off-cell gate electrodes 333a and 333b from physical damage and chemical reactions.

The on-cell gate insulating film 331a' and the off-cell gate insulating film 331b' may function as buffers when ions are implanted into the substrate 320.

Figure 5B:
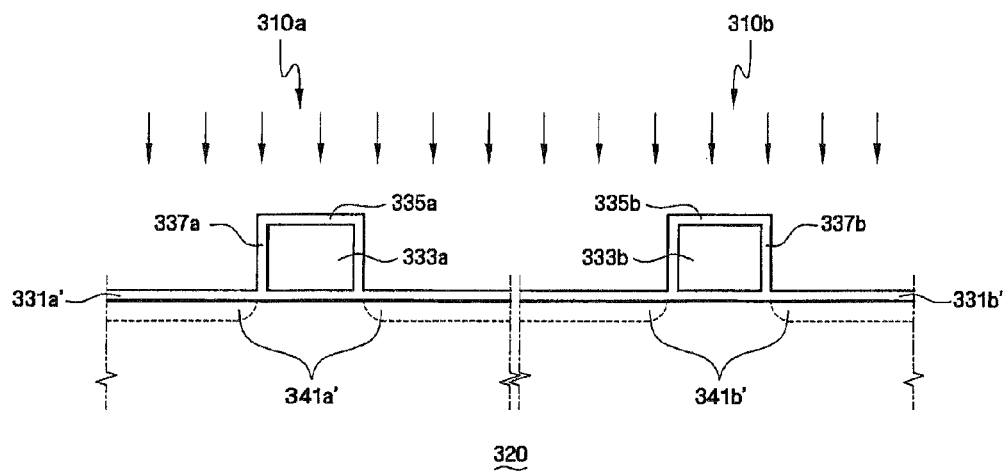

Referring to FIG. 5B, a first ion implantation process is performed on a whole surface of the substrate 320 to form first ion implantation regions 341a' and 341b' in the substrate 320.

The first ion implantation regions 341a' and 341b' may be formed by implanting ions of an opposite polarity to that of a channel. For example, in the case of an NMOS transistor having an N-type channel, the first ion implantation regions 341a' and 341b' may be formed by implanting P-type ions. In the case of a PMOS transistor having a P-type channel, the first ion implantation regions 341a' and 341b' may be formed by implanting N-type ions.

The first ion implantation regions 341a' and 341b' may be formed using the on-cell gate structure 310a' and off-cell gate structure 310b' as ion implantation masks. Therefore, the first ion implantation regions 341a' and 341b' may be aligned with side surfaces of the on-cell gate structure 310a' and off-cell gate structure 310b', respectively (e.g. side ends of the on-cell gate electrode, off-cell gate electrode, the on-cell gate sidewalls and/or the sidewall of the off-cell gate sidewalls). However, after the first ion implantation regions 341a' and 341b' are heat-treated, they may extend under the on-cell gate structure 310a' and off-cell gate structure 310b.

In one embodiment, the first ion implantation regions 341a' and 341b' may be formed by implanting $BF_2^+$ ions. For example, the first ion implantation regions 341a' and 341b' may be formed by perpendicularly implanting the $BF_2^+$ ions into a surface of the substrate 320 to an ion concentration of approximately 4E13 and at an ion acceleration energy of approximately 30 KeV. In this case, the first ion implantation regions 341a' and 341b' may be formed to a depth of approximately 200 to 300 nm. It will be appreciated, however, that this range is a mere example, and the present invention is not limited thereto. That is, the depths of the first ion implantation regions 341a' and 341b' may vary.

Figure 5C:
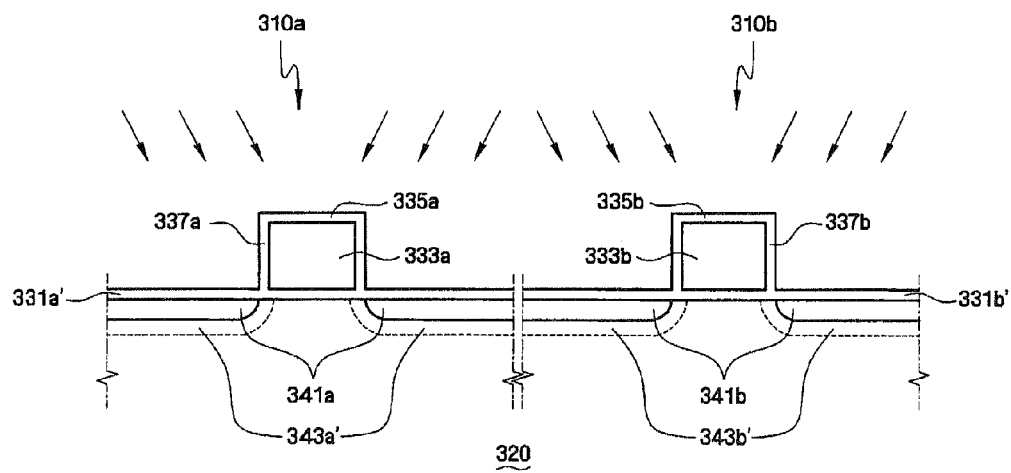

Referring to FIG. 5C, a second ion implantation process is performed on the whole surface of the substrate 320 to form second ion implantation regions 343a' and 343b' in the substrate 320.

The second ion implantation regions 343a' and 343b' may be formed by implanting ions of the same polarity as that of the first ion implantation regions 341a' and 341b'. For example, the second ion implantation regions 343a' and 343b' may be formed by implanting $B^+$ ions into the substrate 320 to an ion concentration of approximately 4E13 and at an ion acceleration energy of approximately 30 KeV. In this case, the second ion implantation process may be an angled process. That is, ions are not implanted in a direction perpendicular to the surface of the substrate 320. Instead, as illustrated in FIG. 5C, the ions are implanted into the substrate 320 at a predetermined angle with respect to the surface of the substrate 320 to form the second ion implantation regions 343a' and 343b'. In one embodiment, the predetermined angle is approximately 0 to 45 degrees. In another embodiment, the predetermined angle is approximately 30 degrees.

With the same ion implantation energy, $B^+$ ions can be implanted deeper than $BF_2^+$ ions as illustrated in FIG. 5C. It is generally known that $B^+$ ions can be implanted approximately five times deeper than $BF_2^+$ ions.

Figure 5D:
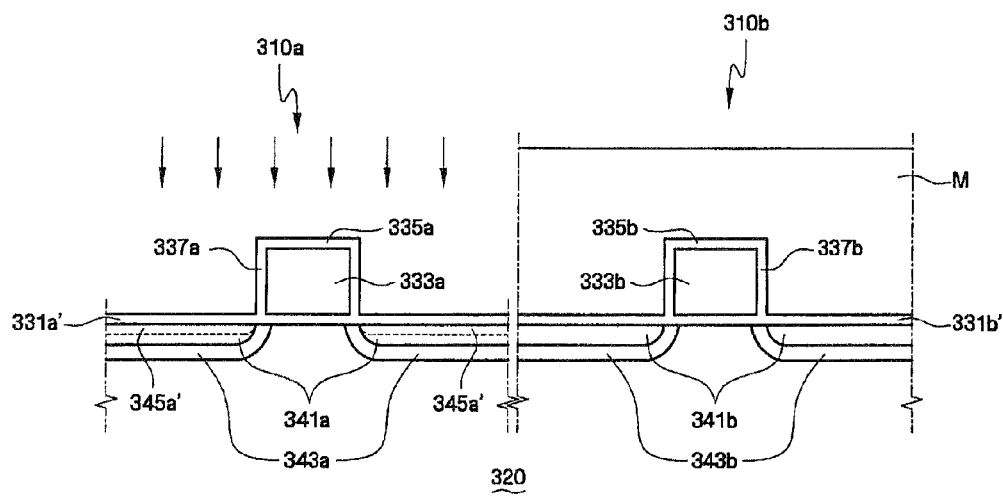

Referring to FIG. 5D, an ion implantation mask M is formed on the off-cell gate structure 310b) to prevent the implantation of ions into the off-cell gate structure 310b). Then, a third ion implantation process is performed to form third ion implantation regions 345a'. The third ion implantation regions 345a' may be aligned with the side ends of the on-cell gate structure 310a'.

The polarity of the third ion implantation regions 345a' may be identical to that of the channel. Accordingly, the polarity of the third ion implantation regions 345a' may be opposite to the polarity of the first and second ion implantation regions 341a, 341b, 343a, and 343b.

In addition, the third ion implantation regions 345a' may have a high concentration of ions in an LDD junction structure. In one embodiment, the third ion implantation regions 345a' may be formed by implanting phosphorous (P), arsenic (As) or the like or a combination thereof.

In one embodiment, the third ion implantation regions 345a' may be shallower than the first ion implantation region 341a. It will be appreciated, however, that the third ion implantation regions 345a' may, alternatively, not be shallower than the first ion implantation region 341a.

Figure 5E:
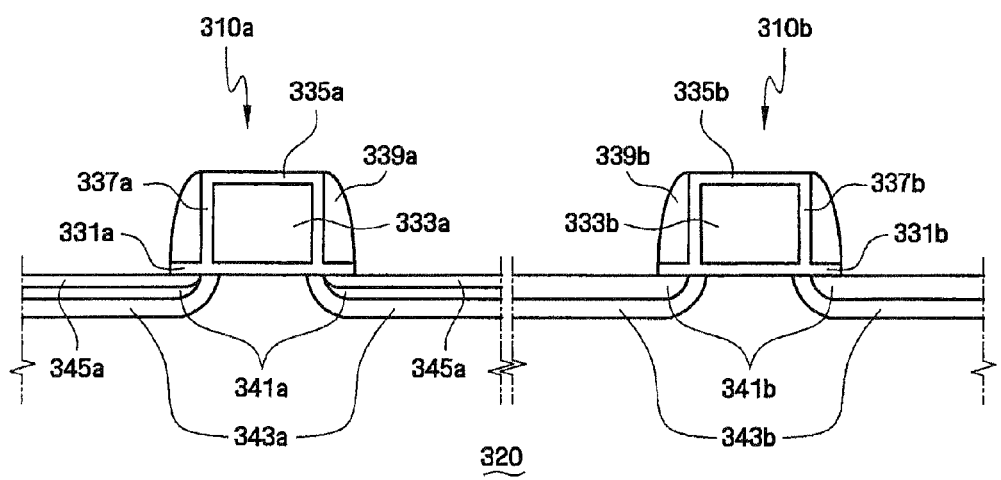

Referring to FIG. 5E, the on-cell gate spacers 339a and off-cell gate spacers 339b are formed on side surfaces of the on-cell gate electrodes 333a and off-cell gate electrodes 333b and the on-cell gate sidewalls 337a and off-cell gate sidewalls 337b, respectively.

Each of the on-cell gate spacers 339a and off-cell gate spacers 339b may include a material such as silicon nitride, silicon oxynitride, or the like or a combination thereof. In one embodiment, each of the on-cell gate spacers 339a and off-cell gate spacers 339b may be formed of a silicon nitride film, a silicon oxy-nitride film, or the like or a combination thereof. In one embodiment, each of the on-cell gate spacers 339a and off-cell gate spacers 339b may be formed by forming an insulating film over the entire substrate 320 (e.g., on the on-cell gate insulating film 331a', off-cell gate insulating film 331b', on-cell gate capping layer 335a, off-cell gate capping layer, on-cell gate sidewalls 337a, and off-cell gate sidewalls 337b) followed by anisotropically etching the insulating film. Since the anisotropic etching method is a well-known technology, a detailed description thereof will be omitted.

Figure 5F:
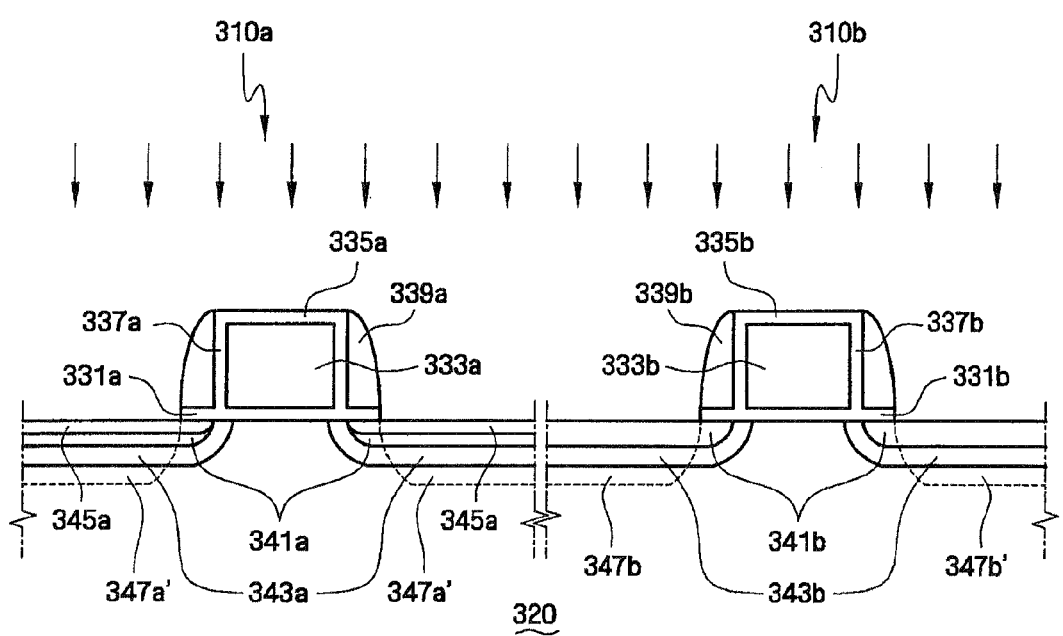

Referring to FIG. 5F, a fourth ion implantation process is performed to form fourth ion implantation regions 347a' and 347b'.

The fourth ion implantation regions 347a' and 347b' may be formed using the on-cell gate structure 310a' and off-cell gate structure 310b', which include the on-cell gate spacers 339a and off-cell gate spacers 339b, respectively, as ion implantation masks. Therefore, the fourth ion implantation regions 347a' and 347b' may be aligned with the on-cell gate spacers 339a and off-cell gate spacers 339b, respectively. It will be appreciated, however, that the fourth ion implantation regions 347a' and 347b' may not be aligned with the on-cell gate spacers 339a and off-cell gate spacers 339b, respectively, because the fourth ion implantation regions 347a' and 347b' may expand after a heat-treatment process.

An exemplary embodiment of a method of fabricating a mask ROM device together with a semiconductor device (e.g., a logic device) will now be described with respect to FIGS. 6A through 6I.

FIGS. 6A through 6I illustrate one embodiment of an exemplary method of forming a semiconductor device including a mask ROM device.

For purposes of discussion, the left half of each drawing represents a mask ROM region and the right half of each drawing represents a complementary metal oxide semiconductor (CMOS) region. The CMOS region may be a logic region, a region for another memory device, or the like. In addition, it is assumed that all transistors in the mask ROM region are NMOS transistors. It will be appreciated, however, that all transistors in the mask ROM region could also be PMOS transistors. For purposes of discussion, it is assumed that all ion implantation masks are photoresist patterns. It will be appreciated, however, that substantially any type of ion implantation mask could be used.

Figure 6A:
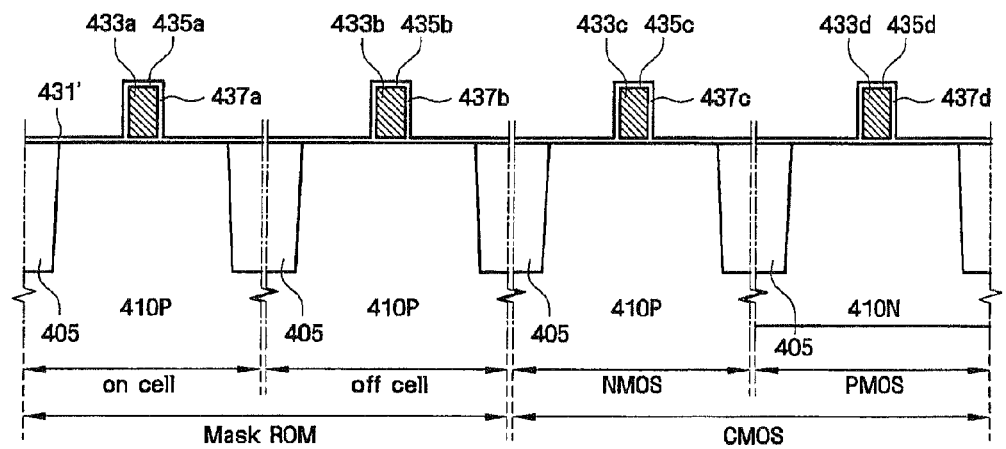
FIGS. 6A through 6I illustrate one embodiment of an exemplary method of forming a semiconductor device including a mask ROM device.

Referring to FIG. 6A, isolation regions 405, P-wells 410P, N-wells 410N, a gate insulating film 431', and gate electrodes 433a through 433d are formed in the mask ROM region and the CMOS region.

In one embodiment, the isolation regions 405 are shallow trench isolation (STI) regions. Since methods of forming the STI regions and the P-well 410P and N-wells 410N are well known, detailed description thereof will be omitted.

The gate insulating film 431' may comprise an insulating material such as silicon oxide, aluminum oxide, hafnium oxide, silicon oxynitride, or the like or a combination thereof. Each of the gate electrodes 433a through 433d may comprise a conductor such as silicon, metal silicide, metal, a metal compound, or the like or a combination thereof.

Since the materials and methods of forming the gate insulating film 431' and the gate electrodes 433a through 433d are well known, a detailed description thereof will be omitted.

Figure 6B:
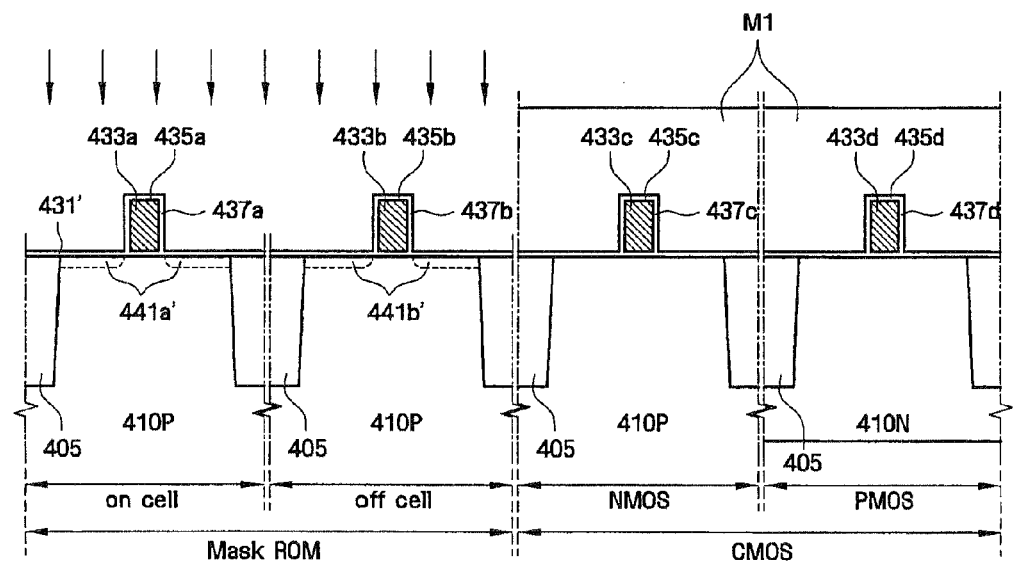

Referring to FIG. 6B, a first ion implantation mask M1 is formed on the CMOS region, and a first ion implantation process is performed on the mask ROM region. As a result, first ion implantation regions 441a' and 441b' are formed.

The first ion implantation regions 441a' and 441b' may be formed by implanting P-type ions.

In the first ion implantation process, $BF_2^+$ ions may be implanted perpendicular to a surface of the substrate 420 to an ion concentration of approximately 4E13 and at an ion acceleration energy of approximately 30 KeV.

Figure 6C:
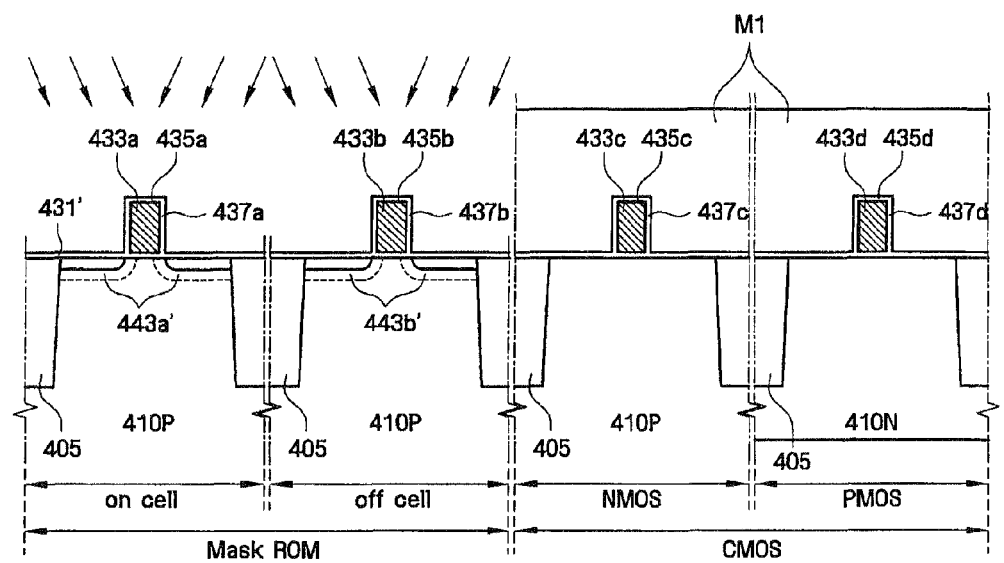

Referring to FIG. 6C, still using the first ion implantation mask M1, a second ion implantation process is performed. As a result, second ion implantation regions 443a' and 443b' are formed.

The second ion implantation regions 443a' and 443b' may be formed by implanting P-type ions.

In the second ion implantation process, $B^+$ ions may be implanted to an ion concentration of approximately 4E13, at an ion acceleration energy of approximately 30 KeV, and at an angle of approximately 30 degrees with respect to the surface of the substrate 420. This process is called "angled ion implantation" and is well known to those of ordinary skill in the art.

In one embodiment, the second ion implantation regions 443a' and 443b' may be deeper than, and wider than, the first ion implantation regions 441a' and 441b'. It is known that the diffusivity of $B^+$ ions within the substrate 420 is approximately five times higher than that of $BF_2^+$ ions. Therefore, with the same ion implantation energy, a region implanted with $B^+$ ions can be formed deeper and wider than a region implanted with $BF_2^+$.

Figure 6D:
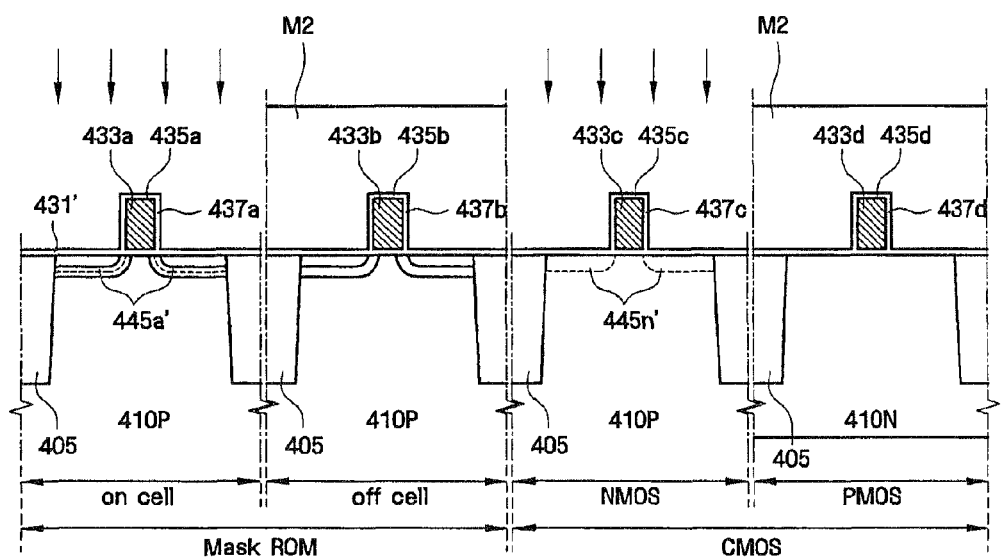

Referring to FIG. 6D, second ion implantation masks M2 are formed on an off-cell region of the mask ROM region and a PMOS region of the CMOS region and a third ion implantation process is performed to form third ion implantation regions 445a' and 445n'.

The third ion implantation regions 445a' and 445n' may be regions implanted with N-type ions or regions having a low concentration of implanted ions in a well-known LDD junction.

The third ion implantation regions 445a' and 445n' may be formed deeper and wider than the first ion implantation region 441a', and may be formed shallower and narrower than the second ion implantation region 443a'.

Figure 6E:
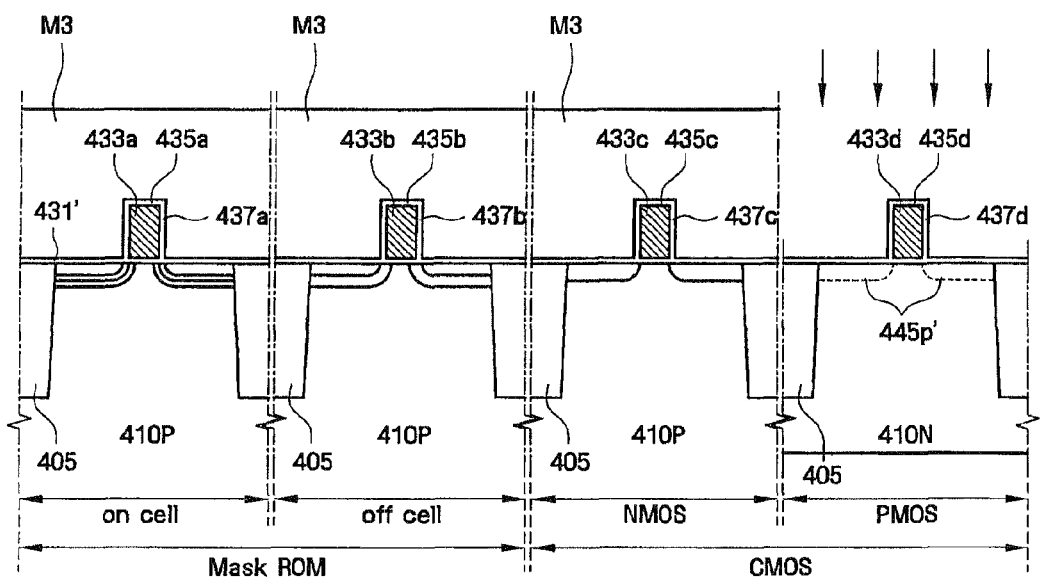

Referring to FIG. 6E, a third ion implantation mask M3 exposing only the PMOS region of the CMOS region is formed and a fourth ion implantation process is performed to form a fourth ion implantation region 445p'. The fourth ion implantation region 445p' corresponds to a lightly ion-implanted region in an LDD junction of the PMOS region.

Figure 6F:
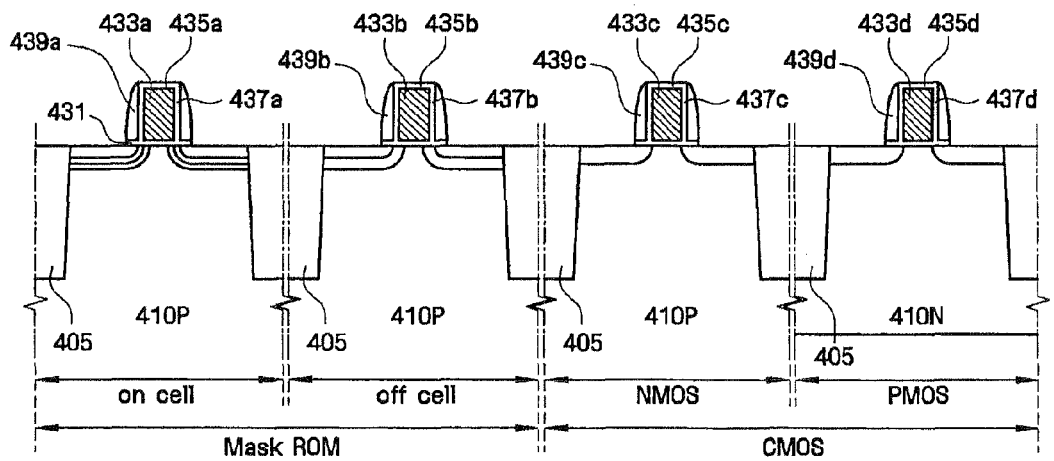

Referring to FIG. 6F, gate spacers 439a through 439d are formed on the gate electrodes 433a through 433d, respectively.

In one embodiment, the gate spacers 439a through 439d are formed on the gate electrodes 433a through 433d, respectively, by forming an insulating film (e.g., comprising silicon nitride, silicon oxynitride, or the like or a combination thereof) on the gate insulating film 431', gate capping layers 435a through 435d, and gate sidewalls 437a through 437d followed by anisotropically etching the insulating film. Since the anisotropic etching method is a well-known technology, a detailed description thereof will be omitted.

Figure 6G:
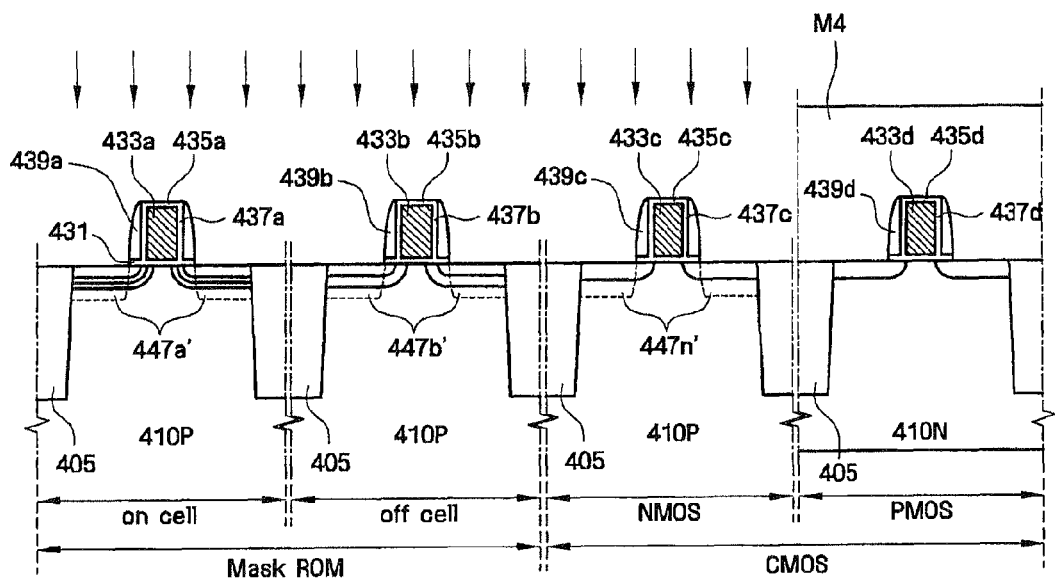

Referring to FIG. 6G, a fourth ion implantation mask M4 is formed on the PMOS region of the CMOS region and a fifth ion implantation process is performed to form fifth ion implantation regions 447a', 447b, and 447n'. The first through fourth ion implantation regions 441a' and 441b', 443a' and 443b', 445a' and 445n', and 445p' are aligned with the gate electrodes 433a through 433d or with gate sidewalls 437a through 437d. The fifth ion implantation regions 447a', 447b' and 447n' are aligned with the gate spacers 439a through 439c.

In the illustrated embodiments, the fifth ion implantation regions 447a', 447b' and 447n' may be deeper than the first through fourth ion implantation regions 441a' and 441b', 443a' and 443b', 445a' and 445n', and 445p'.

The ion implantation processes described above with reference to FIGS. 6D through 6G may be understood based on a process of forming an LDD junction of the PMOS region and a process of forming an LDD junction of the NMOS region. Since a technology of forming an LDD junction is well known, a detailed description thereof will be omitted.

Figure 6H:
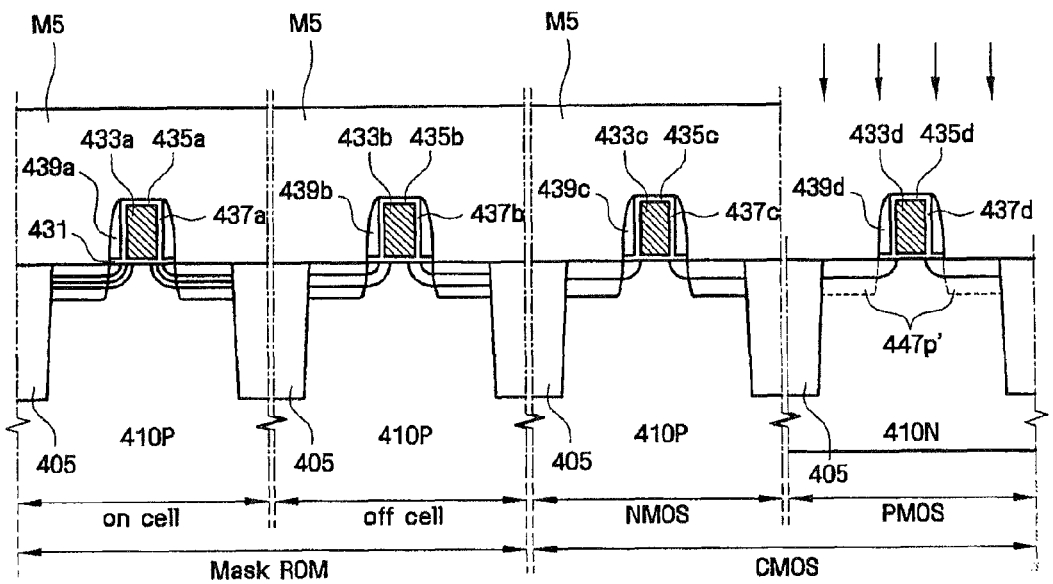

Referring to FIG. 6H, a fifth ion implantation mask M5 exposing the PMOS region of the CMOS region is formed. Then, a sixth ion implantation process is performed to form a sixth ion implantation region 447p'.

The sixth ion implantation region 447p' is aligned with the gate spacer 439d of the PMOS region.

The sixth ion implantation region 447p' corresponds to a lightly ion-implanted region in the LDD junction of the PMOS region.

Figure 6I:
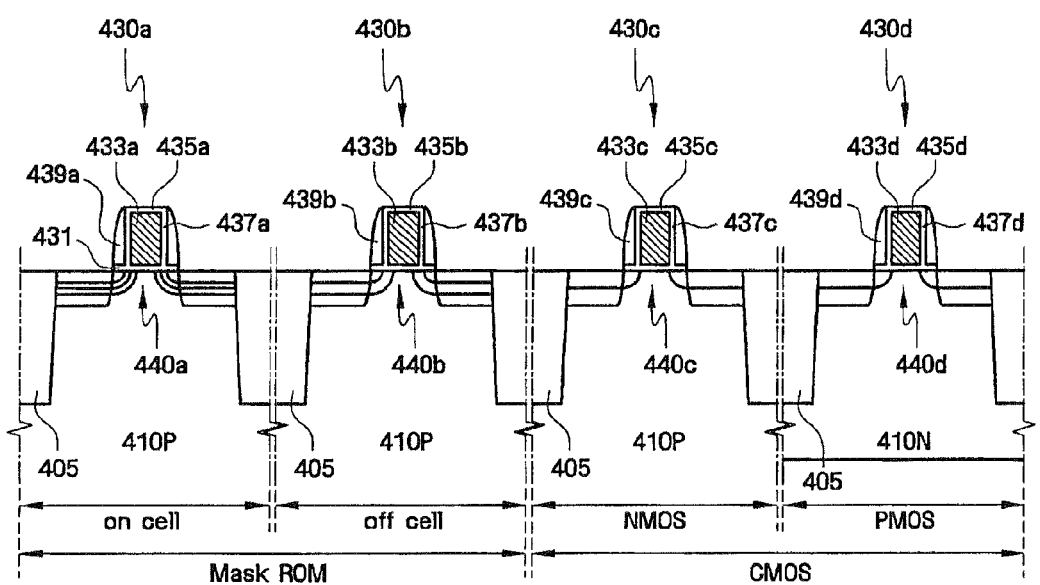

Referring to FIG. 6I, junction structures 440a through 440d are formed in transistor structures of the mask ROM region and the CMOS region, respectively.

In FIG. 6I, the ion implantation regions in each of the junction structures 440a through 440d appear distinct from one another. It will be appreciated, however, that these ion implantation regions they may appear to be a single region.

After the above ion implantation processes, a heat-treatment process may be performed to diffuse the implanted ions. Consequently, a recombination or depletion region may be formed. Accordingly, each ion implantation region may be diffused and expand under each of gate structures 430a through 430d and into the substrate.

As exemplarily described above, an on-cell transistor structure of a mask ROM device can maintain a low leakage current and a sufficiently high breakdown voltage. Because no channel is formed even when an off-cell transistor is activated, the off-cell can stably output data. Such a mask ROM can be simply fabricated without separate photolithography processes by replacing an ion implantation source. A semiconductor device including such a mask ROM device can execute commands and operate in a stable manner, thereby increasing yields.

According to an embodiment, there is provided a mask ROM device. The mask ROM device includes an on-cell having an on-cell gate structure, which includes an on-cell gate insulating film, an on-cell gate electrode and an on-cell gate spacer formed on a substrate, and an on-cell junction structure, which includes, within the substrate, first and second on-cell ion implantation regions of a first polarity and third and fourth on-cell ion implantation regions of a second polarity; and an off-cell having an off-cell gate structure, which includes an off-cell gate insulating film, an off-cell gate electrode and an off-cell gate spacer formed on the substrate, and an off-cell junction structure, which includes, within the substrate, first and second off-cell ion implantation regions of the first polarity and a third off-cell ion implantation region of the second polarity.

According to another embodiment, there is provided a method of fabricating a mask ROM device. The method includes forming an on-cell gate insulating film and an off-cell gate insulating film on a substrate, forming an on-cell gate electrode on the on-cell gate insulating film and forming an off-cell gate electrode on the off-cell gate insulating film, performing a first ion implantation process and a second ion implantation process using ions of a first polarity to form a first on-cell ion implantation region, a first off-cell ion implantation region, a second on-cell ion implantation region and a second off-cell ion implantation region to be aligned with side surfaces of the on-cell gate electrode and the off-cell gate electrode, performing a third ion implantation process using ions of a second polarity and forming a third on-cell ion implantation region to be aligned with the side surfaces of the on-cell gate electrode and the off-cell gate electrode, forming gate spacers on the side surfaces of the on-cell gate electrode and the off-cell gate electrode, and performing a fourth ion implantation process and forming a fourth on-cell ion implantation region and a third off-cell ion implantation region to be aligned with the gate spacers.

According to another embodiment, there is provided a semiconductor device. The semiconductor device includes a mask ROM device including, an on-cell, which has an on-cell gate structure on a substrate and an on-cell junction structure in the substrate, and an off-cell which has an off-cell gate structure on the substrate and an off-cell junction structure in the substrate, and a CMOS including, a PMOS gate structure, which comprises a PMOS gate insulating film, a PMOS gate electrode and a PMOS gate spacer formed on a second region of the substrate, a PMOS structure, which comprises a P-type ion implantation region formed within the second region of the substrate, an NMOS gate structure, which comprises an NMOS gate insulating film, an NMOS gate electrode and an NMOS gate spacer formed on the second region of the substrate, and an NMOS structure which comprises an N-type ion implantation region formed within the second region of the substrate, wherein the on-cell gate structure includes an on-cell gate insulating film, an on-cell gate electrode and an on-cell gate spacer formed on a first region of the substrate, an on-cell junction structure includes, within the first region of the substrate, first and second on-cell ion implantation regions of a first polarity and third and fourth on-cell ion implantation regions of a second polarity, an off-cell gate structure includes an off-cell gate insulating film, an off-cell gate electrode and an off-cell gate spacer formed on the first region of the substrate, and an off-cell junction structure includes, within the first region of the substrate, first and second off-cell ion implantation regions of the first polarity and a third off-cell ion implantation region of the second polarity.

According to another embodiment, there is provided a method of fabricating a semiconductor device. The method includes forming an on-cell gate insulating film and an off-cell gate insulating film on a first region of a substrate and forming a CMOS gate insulating film on a second region of the substrate, forming an on-cell gate electrode on the on-cell gate insulating film, forming an off-cell gate electrode on the off-cell gate insulating film, and forming CMOS gate electrodes, which comprise an NMOS gate electrode and a PMOS gate electrode, on the CMOS gate insulating film, performing a first ion implantation process and a second ion implantation process using ions of a first polarity and forming a first on-cell ion implantation region, a first off-cell ion implantation region, a second on-cell ion implantation region and a second off-cell ion implantation region to be aligned with side surfaces of the on-cell gate electrode and the off-cell gate electrode, performing a third ion implantation process using ions of a second polarity and forming a third on-cell ion implantation region and a first NMOS ion implantation region to be aligned with side surfaces of the on-cell gate electrode and the NMOS gate electrode, performing a fourth ion implantation process using ions of the first polarity and forming a first PMOS ion implantation region to be aligned with a side surface of the PMOS gate electrode, forming an on-cell gate spacer, an off-cell gate spacer, an NMOS gate spacer and a PMOS gate spacer on the side surfaces of the on-cell and off-cell gate electrodes and the NMOS and PMOS gate electrodes, respectively, performing a fifth ion implantation process using ions of the second polarity and forming a fourth on-cell ion implantation region, a third off-cell ion implantation region and a second NMOS ion implantation region to be aligned with the on-cell gate spacer, the off-cell gate spacer and the NMOS gate spacer; and performing a sixth ion implantation region using ions of the first polarity and forming a second PMOS ion implantation region to be aligned with the PMOS gate spacer.

While exemplary embodiments have been shown and described above, it will be understood by those of ordinary skill in the art that various changes in form and detail may be made therein without departing from the spirit and scope of the present invention as defined by the following claims. The exemplary embodiments should be considered in descriptive sense only and not for purposes of limitation.

What is claimed is:

1. A method of fabricating a mask ROM device, the method comprising:

forming an on-cell gate insulating film and an off-cell gate insulating film on a substrate;

forming an on-cell gate electrode on the on-cell gate insulating film;
forming an off-cell gate electrode on the off-cell gate insulating film;
performing a first ion implantation process and a second ion implantation process using ions of a first polarity to form a first on-cell ion implantation region, a first off-cell ion implantation region, a second on-cell ion implantation region and a second off-cell ion implantation region, wherein the first and second on-cell ion implantation regions are aligned with a side surface of the on-cell gate electrode and wherein the first and second off-cell ion implantation regions are aligned with a side surface of the off-cell gate electrode;
performing a third ion implantation process using ions of a second polarity to form a third on-cell ion implantation region that is aligned with the side surfaces of the on-cell gate electrode and the off-cell gate electrode;
forming gate spacers on the side surfaces of the on-cell gate electrode and the off-cell gate electrode; and
performing a fourth ion implantation process to form a fourth on-cell ion implantation region and a third off-cell ion implantation region that are aligned with the gate spacers.

2. The method of claim 1, wherein the first on-cell ion implantation region and the first off-cell ion implantation region are formed by implanting boron fluoride ions, and the second on-cell ion implantation region and the second off-cell ion implantation region are formed by implanting boron ions.

3. The method of claim 1, wherein the first on-cell ion implantation region and the first on-cell ion implantation region are formed by implanting ions into the substrate in a direction perpendicular to the substrate, and the second on-cell ion implantation region and the second off-cell ion implantation region are formed by implanting ions into the substrate at an angle less than approximately 45 degrees with respect to the substrate.

4. The method of claim 1, wherein the first and third on-cell ion implantation regions and the first off-cell ion implantation region are aligned with the side surfaces of the on-cell gate electrode and the off-cell gate electrode, and the fourth on-cell ion implantation region and the third off-cell ion implantation region are aligned with the gate spacers.

5. The method of claim 1, wherein the first on-cell ion implantation region and the first off-cell ion implantation region are formed simultaneously, the second on-cell ion implantation region and the second off-cell ion implantation region are formed simultaneously, and the fourth on-cell ion implantation region and the third off-cell ion implantation region are formed simultaneously.

6. The method of claim 1, wherein the first and second on-cell ion implantation regions and the first and second off-cell ion implantation regions have the same concentration of implanted ions.

7. A method of fabricating a semiconductor device, the method comprising:
forming an on-cell gate insulating film and an off-cell gate insulating film on a first region of a substrate and forming a CMOS gate insulating film on a second region of the substrate;
forming an on-cell gate electrode on the on-cell gate insulating film;
forming an off-cell gate electrode on the off-cell gate insulating film;
forming an NMOS gate electrode and a PMOS gate electrode on the CMOS gate insulating film;
performing a first ion implantation process and a second ion implantation process using ions of a first polarity to form a first on-cell ion implantation region, a first off-cell ion implantation region, a second on-cell ion implantation region and a second off-cell ion implantation region that are aligned with side surfaces of the on-cell gate electrode and the off-cell gate electrode;
performing a third ion implantation process using ions of a second polarity to form a third on-cell ion implantation region and a first NMOS ion implantation region that are aligned with side surfaces of the on-cell gate electrode and the NMOS gate electrode, respectively;
performing a fourth ion implantation process using ions of the first polarity to form a first PMOS ion implantation region that is aligned with a side surface of the PMOS gate electrode;
forming an on-cell gate spacer, an off-cell gate spacer, an NMOS gate spacer and a PMOS gate spacer on the side surfaces of the on-cell and off-cell gate electrodes and the NMOS and PMOS gate electrodes, respectively;
performing a fifth ion implantation process using ions of the second polarity to form a fourth on-cell ion implantation region, a third off-cell ion implantation region and a second NMOS ion implantation region that are aligned with the on-cell gate spacer, the off-cell gate spacer and the NMOS gate spacer, respectively; and
performing a sixth ion implantation region using ions of the first polarity to form a second PMOS ion implantation region that is aligned with the PMOS gate spacer.

* * * * *